US012784940B2

(12) United States Patent
Fukushima

(10) Patent No.: US 12,784,940 B2
(45) Date of Patent: Nov. 3, 2026

(54) ELECTRONIC COMPONENT, ELECTRONIC COMPONENT TERMINAL STRUCTURE, AND ELECTRONIC DEVICE

(71) Applicant: Tokyo Cosmos Electric Co., Ltd., Kanagawa (JP)

(72) Inventor: Hajime Fukushima, Kanagawa (JP)

(73) Assignee: Tokyo Cosmos Electric Co., Ltd., Kanagawa (JP)

( * ) Notice: Subject to any disclaimer, the term of this patent is extended or adjusted under 35 U.S.C. 154(b) by 196 days.

(21) Appl. No.: 18/857,472

(22) PCT Filed: Mar. 23, 2023

(86) PCT No.: PCT/JP2023/011560
§ 371 (c)(1),
(2) Date: Oct. 17, 2024

(87) PCT Pub. No.: WO2023/210222
PCT Pub. Date: Nov. 2, 2023

(65) Prior Publication Data

US 2025/0259770 A1 Aug. 14, 2025

(30) Foreign Application Priority Data

Apr. 25, 2022 (JP) ................................ 2022-071792

(51) Int. Cl.
*H01C 1/14* (2006.01)
*H01C 10/00* (2006.01)
*H05K 1/18* (2026.01)

(52) U.S. Cl.
CPC ............. *H01C 1/14* (2013.01); *H01C 10/005* (2013.01); *H05K 1/18* (2013.01); *H05K 2201/10022* (2013.01); *H05K 2201/10757* (2013.01)

(58) Field of Classification Search
CPC . H01C 1/14; H01C 1/01; H01C 10/00; H01C 10/005; H05K 7/12; H05K 1/18;
(Continued)

(56) References Cited

U.S. PATENT DOCUMENTS 4,029,375 A * 6/1977 Gabrielian ........... H01R 12/714 439/824
6,020,635 A * 2/2000 Murphy ............. H01R 13/2421 257/727

(Continued)

FOREIGN PATENT DOCUMENTS

JP 2000-243167 9/2000
JP 2003-189383 7/2003

*Primary Examiner* — Timothy J Thompson
*Assistant Examiner* — Michael F McAllister

(57) ABSTRACT

This electronic component, electronic component terminal structure and electronic device do not use solder, and as a result, make it possible to prevent an environmental impact, reduce assembly cost and reduce the burden on an electrical connecting section. An electronic component equipped with an electronic component main body and a conductive terminal, wherein the terminal is a coil spring which is expandably fitted into a guide groove provided to the electronic component main body, and contacts a printed circuit board while in a compressed state. For example, the guide groove extends in a prescribed direction and connects the interior of the electronic component main body and the exterior thereof to one another, and the coil spring is supported so as not to fall to the exterior side of the electronic component main body from the guide groove.

9 Claims, 8 Drawing Sheets

(58) Field of Classification Search
CPC .......... H05K 2201/10022; H05K 2201/10757; H01H 19/58; H01R 13/2421
USPC .......................................................... 361/782
See application file for complete search history.

(56) References Cited

U.S. PATENT DOCUMENTS

| | | | | |
|---|---|---|---|---|
| 6,095,823 | A * | 8/2000 | Banks ................ | H01R 13/2421 439/876 |
| 7,878,834 | B2 * | 2/2011 | Sherman ................ | H01R 12/57 439/324 |
| 8,162,684 | B1 * | 4/2012 | Sochor ................. | H01R 13/639 439/289 |
| 10,749,283 | B2 * | 8/2020 | Squire ................ | H01R 12/7023 |
| 2003/0112994 | A1 | 6/2003 | Imahori et al. | |

* cited by examiner

ELECTRONIC COMPONENT, ELECTRONIC COMPONENT TERMINAL STRUCTURE, AND ELECTRONIC DEVICE

TECHNICAL FIELD

The present invention relates to an electronic component, an electronic component terminal structure, and an electronic apparatus.

BACKGROUND ART

It has been known that soldering is performed to connect between a terminal of an electronic component and a printed circuit board.

In a case where the soldering is performed by a soldering robot, the facility cost increases. Further, in a case where the soldering is performed by an operator, the number of man-hours in the soldering work increases. For this reason, there is a problem of the high assembly cost. Further, there is also a problem in that an environmental load is generated by using solder.

Further, Patent Literature (hereinafter referred to as "PTL") 1 discloses an electronic apparatus including two contact members that are disposed to face each other and a coil spring that is disposed between the two contact members, in which end portions of the coil spring are welded respectively to the two contact members with a conductive adhesive.

CITATION LIST

Patent Literature

PTL 1

Japanese Patent Application Laid-Open No. 2000-243167

SUMMARY OF INVENTION

Technical Problem

In the electronic apparatus described in PTL 1, when the end portions of the coil spring are welded respectively to the contact members with the conductive adhesive, the coil spring is held in a predetermined position with, for example, a jig, and then the welding is performed, thus taking the man-hours as in the soldering work. This causes a problem of the high assembly cost.

Further, for example, application of an impact or the like to an electronic component causes a problem in that a load is applied to an electrical connection portion subjected to soldering or an electrical connection portion welded by a conductive adhesive.

An object of the present invention is to provide an electronic component, a terminal structure of an electronic component, and an electronic apparatus each capable of preventing an environmental load, reducing the assembly cost, and reducing a load on an electrical connection portion, by not using solder.

Solution to Problem

To achieve the above-described object, an electronic component according to the present invention includes: an electronic component main body; and a terminal that has conductivity, in which the terminal is a coil spring that is fitted to a guidance groove provided in the electronic component main body in a manner capable of expanding and contracting, and that is in contact with a printed circuit board in a compressed state.

An electronic component terminal structure according to the present invention is a terminal structure of an electronic component including an electronic component main body, the terminal structure including: a terminal that has conductivity, in which the terminal is fitted to a guidance groove provided in the electronic component main body in a manner capable of expanding and contracting, and that is in contact with a printed circuit board in a compressed state.

An electronic apparatus according to the present invention includes: the above-described electronic component; a case that houses the above-described electronic component; and a printed circuit board.

Advantageous Effects of Invention

According to the present invention, it is possible to reduce the assembly cost and to reduce the load on an electrical connection portion.

DESCRIPTION OF EMBODIMENTS

Figure 1:
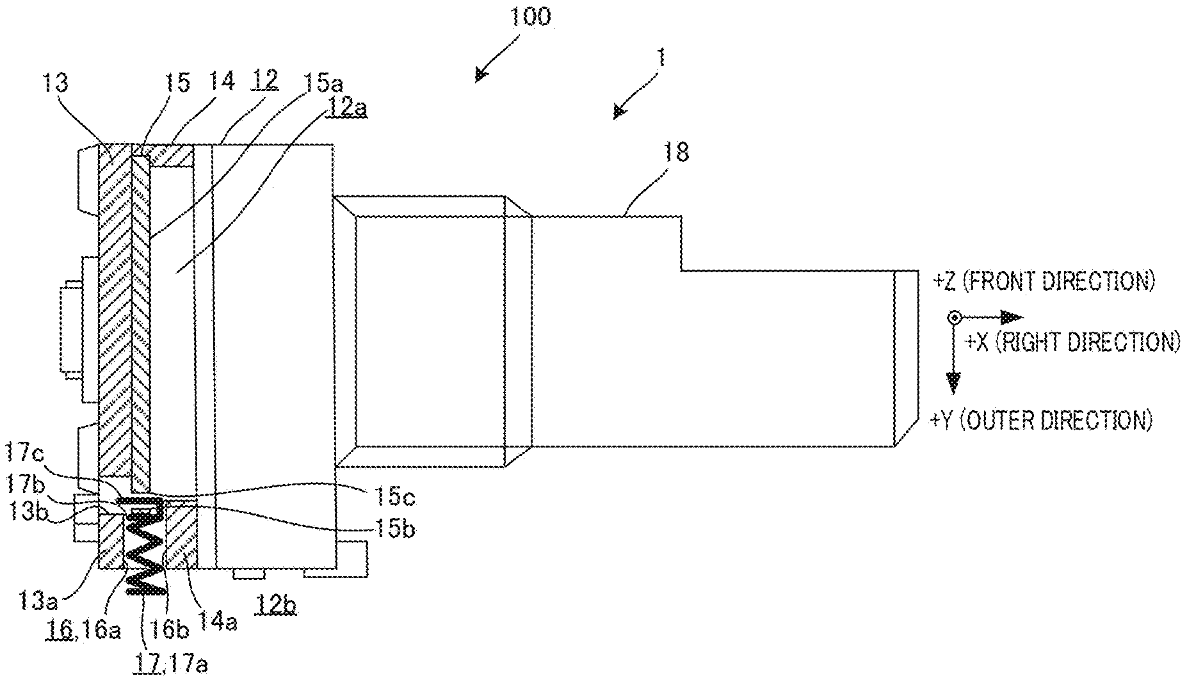
FIG. 1 is an overall view of an electronic component according to an embodiment of the present invention, illustrating a part of the electronic component in cross section.

Hereinafter, an embodiment of the present invention will be described with reference to the drawings. FIG. 1 is an overall view of an electronic component according to an embodiment of the present invention, illustrating a part of the electronic component in cross section. FIG. 1 illustrates X, Y, and Z axes. In FIG. 1, a right-left direction will be referred to as an X direction, a right direction will be referred to as a right side or a "+X direction," and a left direction will be referred to as a left side or "−X direction." Further, an up-down direction in FIG. 1 is referred to as a Y direction, and a direction moving away from the X axis along the Y axis is referred to as an outer side, an outside, an outer direction, or a "+Y direction," and a direction approaching the X axis along the Y axis is referred to as an inner side, an inside, an inner direction, or a "−Y direction." Further, a direction orthogonal to the plane in FIG. 1 is referred to as a Z direction, a front direction is referred to as a "+Z direction," and a rear direction is referred to as a "−Z direction."

Electronic apparatus 100 in the present embodiment includes electronic component 1, a case (not illustrated), and a printed circuit board (not illustrated). In the present embodiment, electronic component 1 is a potentiometer that outputs a voltage corresponding to a mechanical displacement amount of the rotation of an input shaft, or a rotary encoder that converts the mechanical displacement amount of the rotation of the input shaft into a digital amount.

As illustrated in FIG. 1, electronic component 1 includes electronic component main body 12 and coil spring 17. Electronic component main body 12 includes a shaft bearing (not illustrated) that rotatably supports input shaft 18.

Electronic component main body 12 includes first main body portion 13, second main body portion 14, resistance substrate 15, and guidance groove 16. First main body portion 13 is disposed on the left side (−X direction) relative to second main body portion 14. Resistance substrate 15 is disposed between first main body portion 13 and second main body portion 14.

First main body portion 13 includes a rectangular-shaped frame portion. First groove portion 16*a* is disposed on a right-side wall surface of lower-side edge portion 13*a* of the frame portion. First groove portion 16*a* has a shape matching with an outer peripheral shape of coil spring 17. For example, first groove portion 16*a* has an arc-shaped cross-sectional shape. Note that first groove portion 16*a* may have a U-shaped cross-sectional shape.

Second main body portion 14 includes a rectangular frame portion. Second groove portion 16*b* is disposed on a left side wall surface of lower-side edge portion 14*a* of the frame portion. Second groove portion 16*b* has a shape matching with an outer peripheral shape of coil spring 17. For example, second groove portion 16*b* has an arc-shaped cross-sectional shape. Note that second groove portion 16*b* may have a U-shaped cross-sectional shape.

Figure 2:
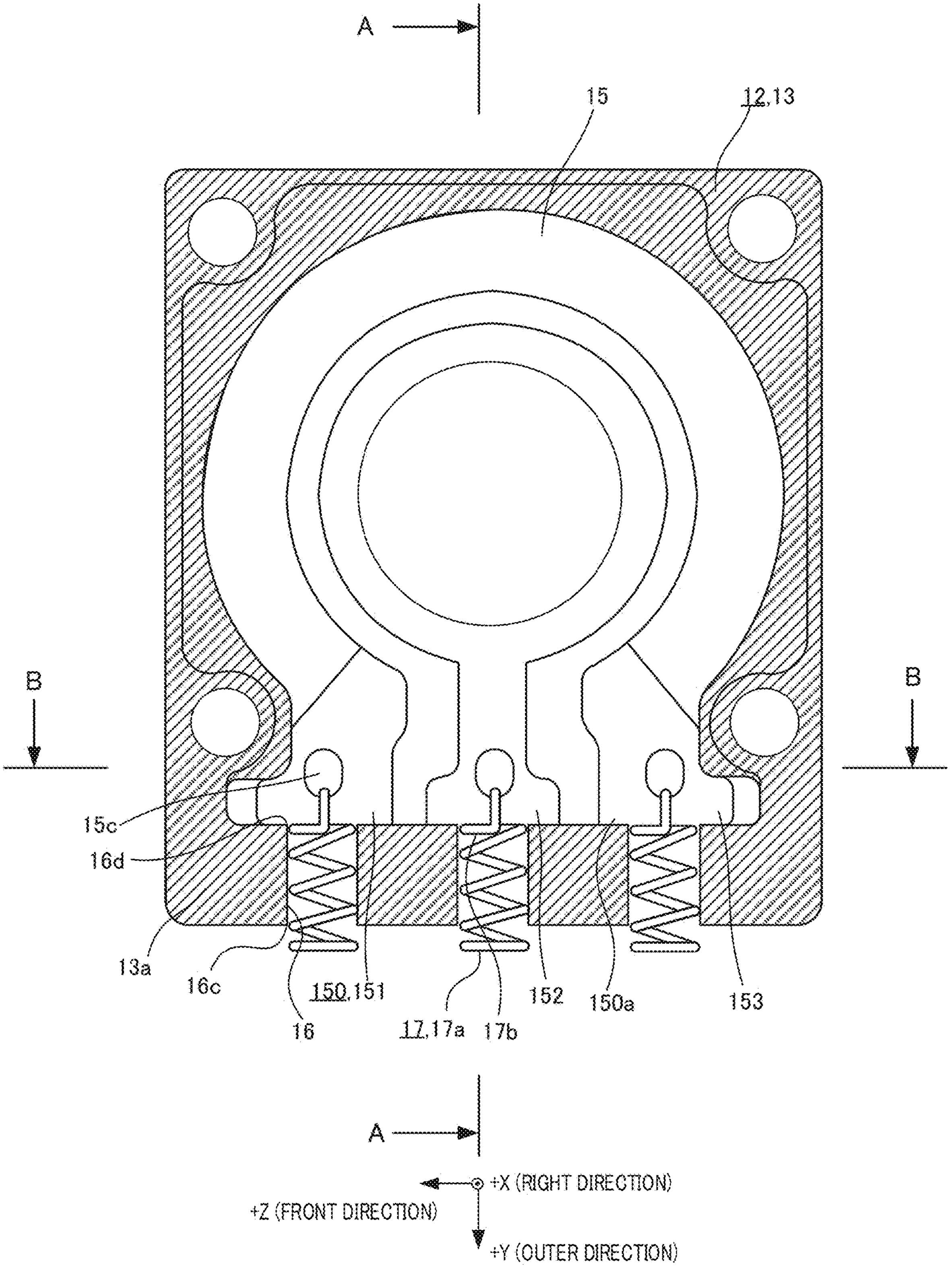
FIG. 2 is a front view of a terminal structure of the electronic component.

Each of a plurality of electrode patterns 150 is fixed to right-side wall surface 15*a* of resistance substrate 15. Note that each of the plurality of electrode patterns 150 is formed to extend to a lower end portion of resistance substrate 15. FIG. 2 is a front view of a terminal structure of electronic component 1. As illustrated in FIG. 2, each of the plurality of electrode patterns 150 includes input electrode pattern 151, output electrode pattern 152, and ground electrode pattern 153. Locking hole 15*c* is disposed on the position of each of outer end portions 150*a* (lower end portions illustrated in FIG. 3) of the plurality of electrode patterns 150. Locking hole 15*c* penetrates in the X direction. Locking hole 15*c* is a long hole with the up-down direction (Y direction) as a longitudinal direction thereof.

Figure 3:
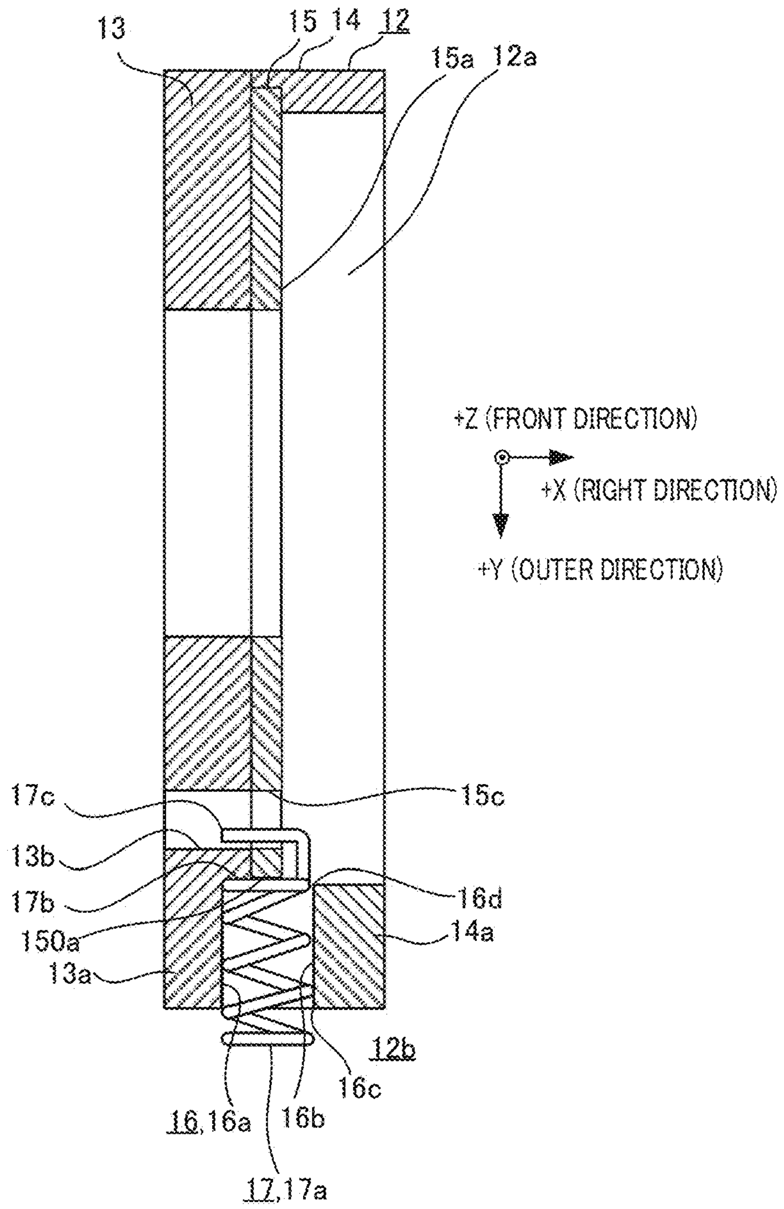
FIG. 3 is a cross-sectional view taken along line A-A of FIG. 2.
Figure 4:
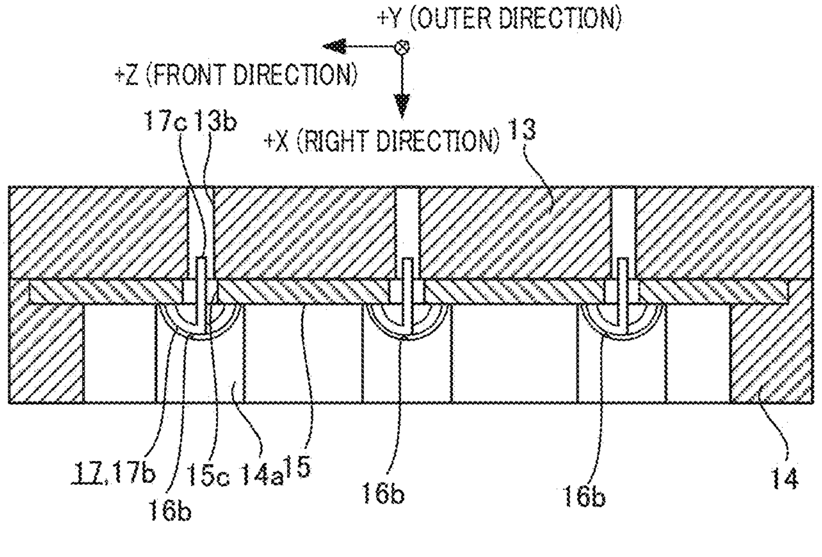
FIG. 4 is a cross-sectional view taken along line B-B of FIG. 2.

FIG. 3 is a cross-sectional view taken along line A-A of FIG. 2. FIG. 4 is a cross-sectional view taken along line B-B of FIG. 2. As illustrated in FIGS. 3 and 4, locking hole 13*b* is disposed on first main body portion 13. Locking hole 13*b* penetrates in the X direction. Locking hole 13*b* is disposed correspondingly to each of locking holes 15*c* in the X direction, and is a long hole with the up-down direction (Y direction) as a longitudinal direction thereof, as with locking hole 15*c*.

Three guidance grooves 16 are disposed respectively to outer end portions 150*a* (lower end portions illustrated in FIG. 3) of the plurality of electrode patterns 150. Three guidance grooves 16 have the same configuration as each other.

Guidance groove 16 extends in the Y direction and communicates between inner portion 12*a* and outer portion 12*b* of electronic component main body 12. Guidance groove 16 is formed into an approximately circular cross-sectional shape by arranging first groove portion 16*a* having an arc-shaped cross-sectional shape disposed on lower-side edge portion 13*a* and second groove portion 16*b* having an arc-shaped cross-sectional shape disposed on lower-side edge portion 14*a* to face each other in the X direction. Outer groove opening 16*c* is located in an outer end of guidance groove 16. Inner groove opening 16*d* is located in an inner end of guidance groove 16. Coil spring 17 is fitted to guidance groove 16 in a manner capable of expanding and contracting.

Coil spring 17 fitted to each of the three guidance grooves has the same configuration as each other. An outer diameter of coil spring 17 is smaller than an inner diameter of guidance groove 16. Coil spring 17 is a terminal having conductivity. At the time of assembly of electronic apparatus 100, outer end portion 17*a* of coil spring 17 (lower end portion in FIG. 3) comes into contact with the printed circuit board (not illustrated). Coil spring 17 is thus brought into a contracted state.

In a case where coil spring 17 is in the compressed state, inner end portion 17*b* (upper end portion in FIG. 3) of coil spring 17 comes into contact with outer end portion 150*a* (lower end portion in FIG. 3) of each of electrode patterns 150.

Coil spring 17 is supported such that coil spring 17 does not come off guidance groove 16 to a side of outer portion 12*b* of electronic component main body 12. Specifically, coil spring 17 includes locking portion 17*c* (corresponding to "first locking portion" of the present invention) that locks to locking hole 15*c*. Locking portion 17*c* extends inward (−Y direction) from inner end portion 17*b*, is bent to a left side (−X direction) at a position corresponding to locking hole 15*c*, and is fitted to each of locking hole 15*c* and locking hole 13*b*. As described above, locking hole 15*c* (locking hole 13*b*) is a long hole with the up-down direction (Y direction) as the longitudinal direction thereof. A positional relationship in the up-down direction between locking hole 15*c* (locking hole 13*b*) and locking portion 17*c* is a relation in which, in the assembly of electronic apparatus 100, inner end portion 17*b* of coil spring 17 can be brought into contact with outer end portion 150*a* of electrode pattern 150 by coil spring 17 moving in the up-down direction within guidance groove 16.

Next, an example of an method of assembling of electronic apparatus 100 will be described briefly. First, a description will be given of an assembly direction of electronic component 1. Note that, at the time of assembly of electronic apparatus 100, a case (not illustrated) is disposed in the upward direction in FIG. 1 of electronic component 1, and a printed circuit board (not illustrated) is disposed in the downward direction in FIG. 1 of electronic component 1.

First, resistance substrate 15 is disposed at a predetermined position in first main body portion 13 from the right direction (+X direction).

Next, coil spring 17 is fitted into first groove portion 16*a* from the right direction (+X direction). Further, locking portion 17*c* of coil spring 17 is locked to each of locking hole 15*c* and locking hole 13*b*.

Next, second main body portion 14 is disposed to face the predetermined position in first main body portion 13 from the right direction (+X direction) and is assembled with first main body portion 13. Note that second main body portion 14 and input shaft 18 are assembled in advance. Thus, electronic component 1 is assembled. Locking of locking portion 17*c* to locking hole 15*c* or the like prevents coil spring 17 from coming off from electronic component main body 12, and thus, electronic component 1 can be easily handled.

Next, assembled electronic component 1 is disposed at a predetermined position in the case (not illustrated) from the downward direction in FIG. 1.

Next, the printed circuit board (not illustrated) is disposed at a predetermined position in the case from the downward direction in FIG. 1.

Next, the case and the printed circuit board are assembled by a joining member (for example, screw). Thus, electronic component 1 is held between the case and the printed circuit board, which leads to a state where coil spring 17 is compressed between the electrode pattern and the printed circuit board. In a state in which coil spring 17 is compressed, outer end portion 17*a* of coil spring 17 is in contact with the printed circuit board. Further, inner end portion 17*b* of coil spring 17 is in contact with outer end portion 150*a* of each of the plurality of electrode patterns 150. The electrical connection portion connecting between outer end portion 17*a* of coil spring 17 and the printed circuit board is an electrical connection portion not subjected to soldering. Further, the electrical connection portion connecting between inner end portion 17*b* of coil spring 17 and outer end portion 150*a* of electrode pattern 150 is an electrical connection portion not subjected to soldering.

Electronic component 1 according to the above-described embodiment includes electronic component main body 12 and a terminal that has conductivity, in which the terminal is coil spring 17 that is fitted to guidance groove 16 provided in electronic component main body 12 in a manner capable of expanding and contracting, and that is in contact with a printed circuit board in a compressed state.

With the above configuration, when coil spring 17 comes into contact with the printed circuit board in the compressed state, an electrical connection portion connecting between coil spring 17 and the printed circuit board is formed, which eliminates the need for an electrical connection portion subjected to soldering, thereby reducing the assembly cost and reducing the load on the electrical connection portion.

Further, in electronic component 1 according to the above embodiment, guidance groove 16 extends in a predetermined direction (Y direction) and communicates between inner portion 12*a* and outer portion 12*b* of electronic component main body 12, and coil spring 17 is supported so as not to come off from guidance groove 16 toward the side of outer portion 12*b* of electronic component main body 12. Thus, since coil spring 17 does not come off from electronic component main body 12, it is possible to easily handle electronic component 1 and to increase the transportability of electronic component 1.

In addition, in electronic component 1 according to the above embodiment, inner portion 12*a* of electronic component main body 12 includes resistance substrate 15, and coil spring 17 includes locking portion 17*c* that locks to resistance substrate 15 such that coil spring 17 does not come off from guidance groove 16 to the side of outer portion 12*b* of electronic component main body 12. Locking of locking portion 17*c* to resistance substrate 15 makes it possible to increase the assembly property and the like of electronic component 1 because coil spring 17 does not come off from electronic component main body 12.

(Variation 1)

Next, a variation of the terminal structure of electronic component 1 according to the present embodiment will be described. Note that, in the descriptions of the following variations, configurations different from those in the above embodiment will be mainly described, whereas the identical components are given the same reference numerals, and the descriptions thereof will be omitted.

Figure 5:
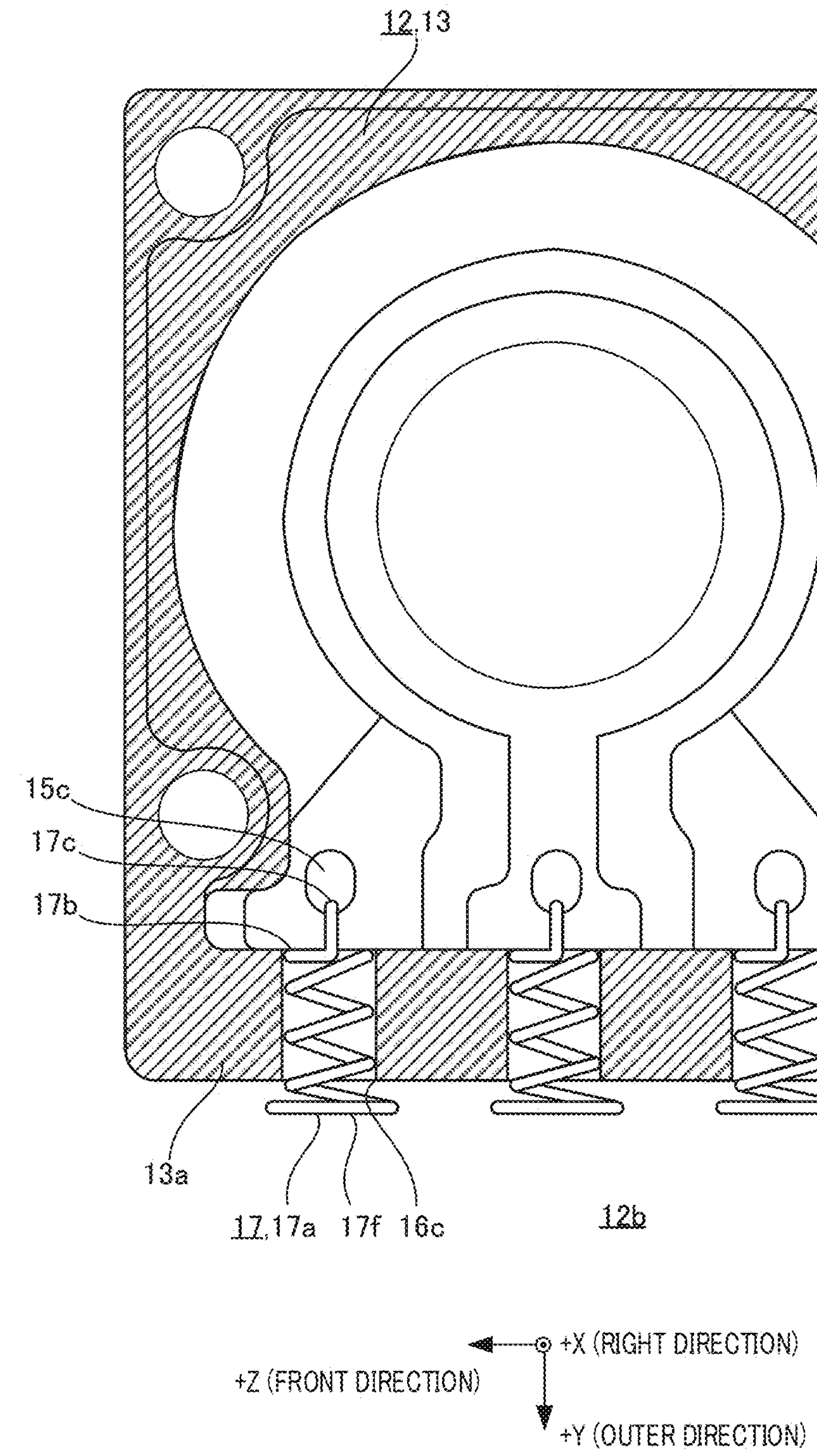
FIG. 5 is a front view of a terminal structure of an electronic component according to Variation 1.

First, a terminal structure of electronic component 1 according to Variation 1 will be described with reference to FIG. 5. FIG. 5 is a front view of a terminal structure of electronic component 1 according to Variation 1.

As illustrated in FIGS. 2 and 3, the outer diameter of coil spring 17 according to the above embodiment is smaller than the inner diameter of guidance groove 16. Further, outer diameters of outer end portion 17*a*, inner end portion 17*b* of coil spring 17, and a central portion between outer end portion 17*a* and inner end portion 17*b* are the same as each other.

In contrast, in Variation 1, an outer diameter of outer end portion 17*a* is larger than an outer diameter of inner end portion 17*b* and an outer diameter of a central portion, as illustrated in FIG. 5. Outer end portion 17*a* includes locking portion 17*f* (corresponding to “third locking portion” of the present invention) locks to a peripheral edge portion of outer groove opening 16*c* of guidance groove 16 such that the outer end portion does not enter guidance groove 16 from a side of outer portion 12*b* of electronic component main body 12. This makes it possible to prevent outer end portion 17*a* from entering guidance groove 16 from the side of outer portion 12*b* of electronic component main body 12 due to an erroneous operation or the like.

(Variation 2)

Figure 6:
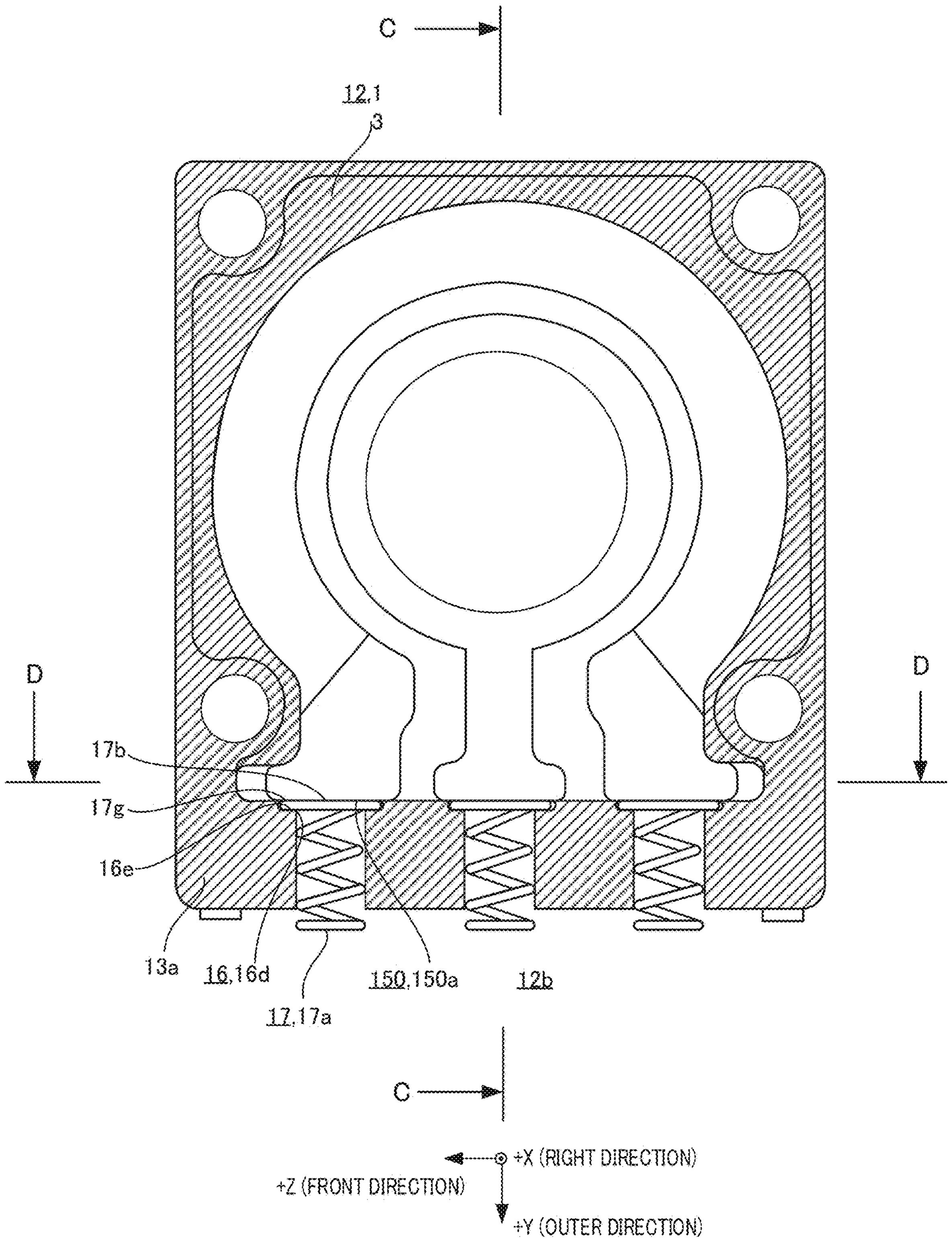
FIG. 6 is a front view of a terminal structure of an electronic component according to Variation 2.
Figure 7:
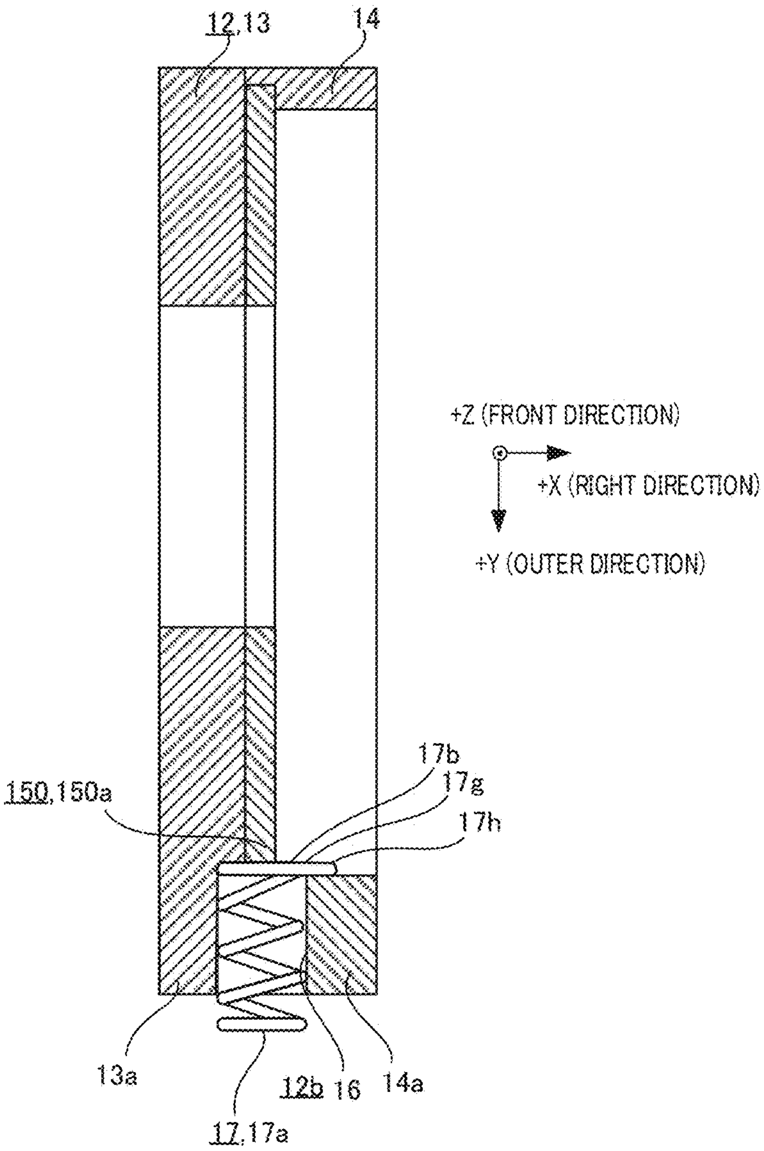
FIG. 7 is a cross-sectional view taken along line C-C of FIG. 6.
Figure 8:
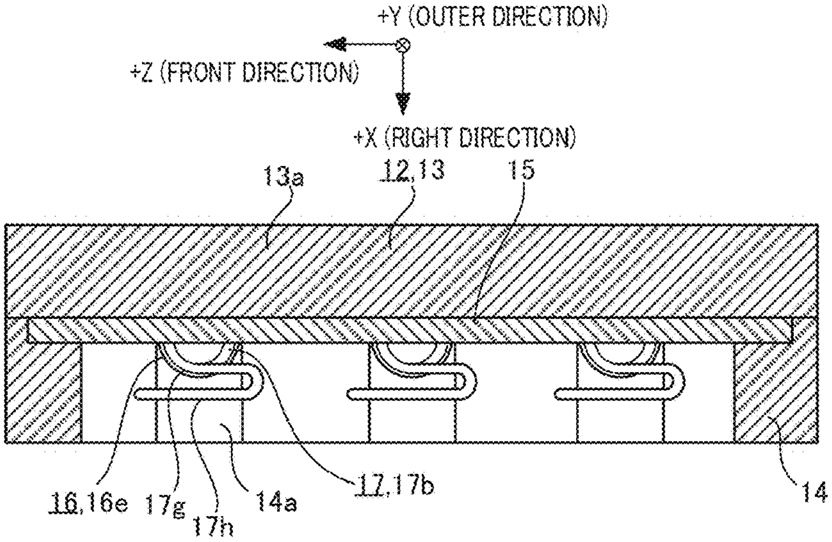
FIG. 8 is a cross-sectional view taken along line D-D of FIG. 6.

Next, a terminal structure of electronic component 1 according to Variation 2 will be described with reference to FIGS. 6, 7, and 8. FIG. 6 is a front view of a terminal structure of electronic component 1 according to Variation 2. FIG. 7 is a cross-sectional view taken along line C-C of FIG. 6. FIG. 8 is a cross-sectional view taken along line D-D of FIG. 6.

In coil spring 17 according to the above embodiment described above, as illustrated in FIGS. 2 and 3, outer diameters of outer end portion 17*a*, inner end portion 17*b* of coil spring 17, and a central portion between outer end portion 17*a* and inner end portion 17*b* are the same as one another.

In contrast, in Variation 2, an outer diameter of inner end portion 17*b* of coil spring 17 is larger than the outer diameter of each of outer end portion 17*a* and a central portion, as illustrated in FIG. 6. Thus, inner end portion 17*b* locks to a peripheral edge portion of inner groove opening 16*d* of guidance groove 16. As a result, coil spring 17 does not come off from guidance groove 16 to a side of outer portion 12*b* of electronic component main body 12. That is, coil spring 17 according to Variation 2 includes locking portion 17*g* (corresponding to “second locking portion” of the present invention) that locks to guidance groove 16.

In electronic component 1 according to Variation 2, since coil spring 17 includes locking portion 17*g*, locking portion 17*g* locks to the peripheral edge portion of inner groove opening 16*d* even in a case where coil spring 17 is pulled outward (+Y direction) due to an erroneous operation, and thus, it is possible to prevent coil spring 17 from coming off from guidance groove 16 to the side of outer portion 12*b* of electronic component main body 12. Since coil spring 17 does not come off from electronic component main body 12, electronic component 1 can be easily handled.

Further, locking portion 17*g* according to Variation 2 extends from the peripheral edge portion of inner groove opening 16*d* rearward (−Z direction), is bent at 180 degrees, and further includes extension portion 17*h* that extends frontward (+Z direction), as illustrated in FIGS. 7 and 8. Extension portion 17*h* locks to a central portion in the left-right direction on an upper surface of lower-side edge portion 14*a*. Thus, an area in which extension portion 17*h* locks to lower-side edge portion 14*a* increases, and thus, it is possible to surely prevent coil spring 17 from coming off from guidance groove 16 to the side of outer portion 12*b* of electronic component main body 12.

Further, as illustrated in FIGS. 6 and 8 in Variation 2, fitting groove 16*e* is disposed in the peripheral edge portion of inner groove opening 16*d* of guidance groove 16. When locking portion 17*g* is fitted to fitting groove 16*e*, movement in a radial direction of the inner end portion 17*b* of the coil spring 17 is limited, thereby increasing the contact stability of inner end portion 17*b* with outer end portion 150*a* of the electrode pattern 150. Further, since the movement in the radial direction of inner end portion 17*b* is limited, the assembly property of coil spring 17 can be increased.

(Variation 3)

Figure 9:
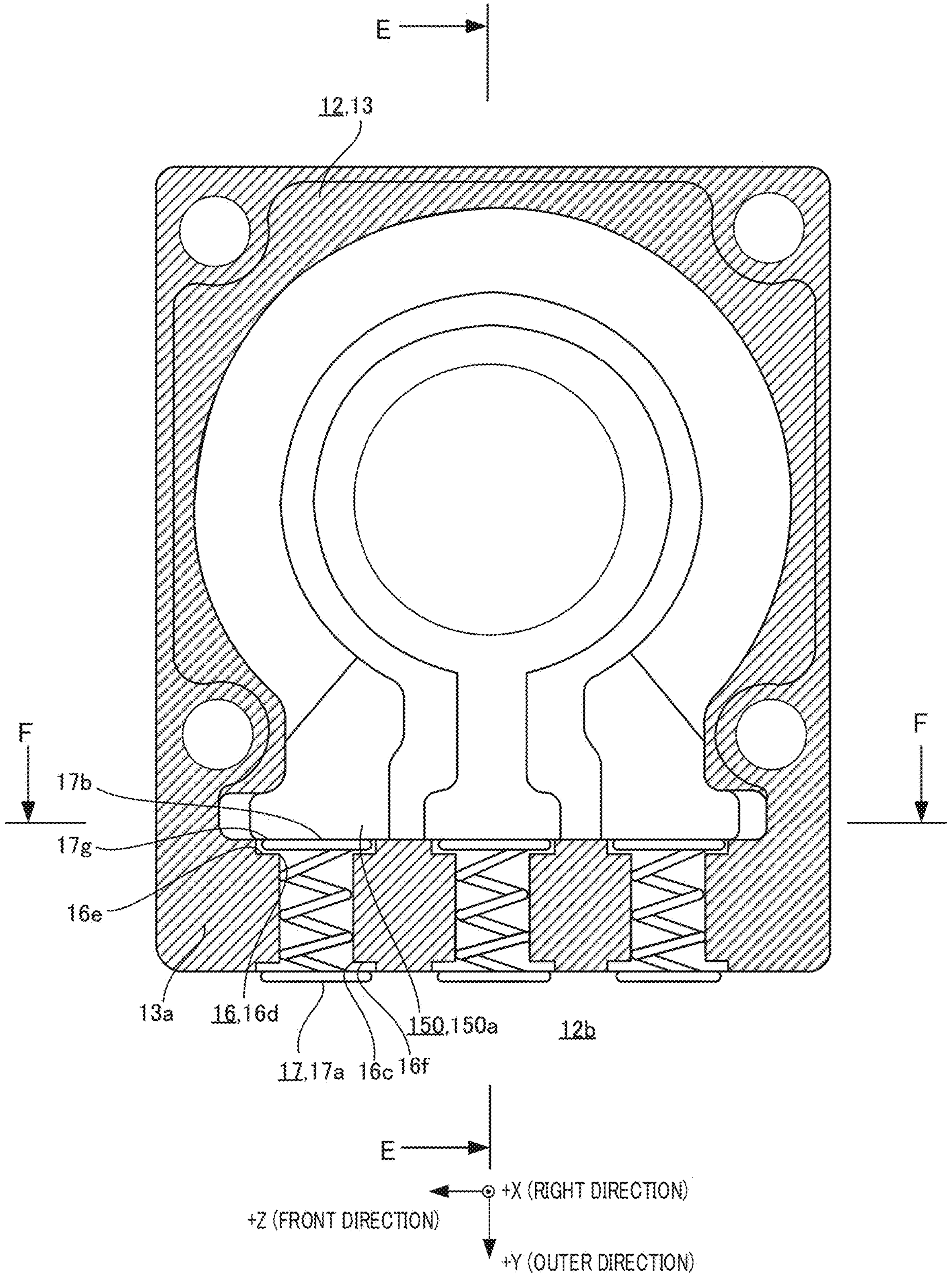
FIG. 9 illustrates a variation of the terminal structure of the electronic component.
Figure 10:
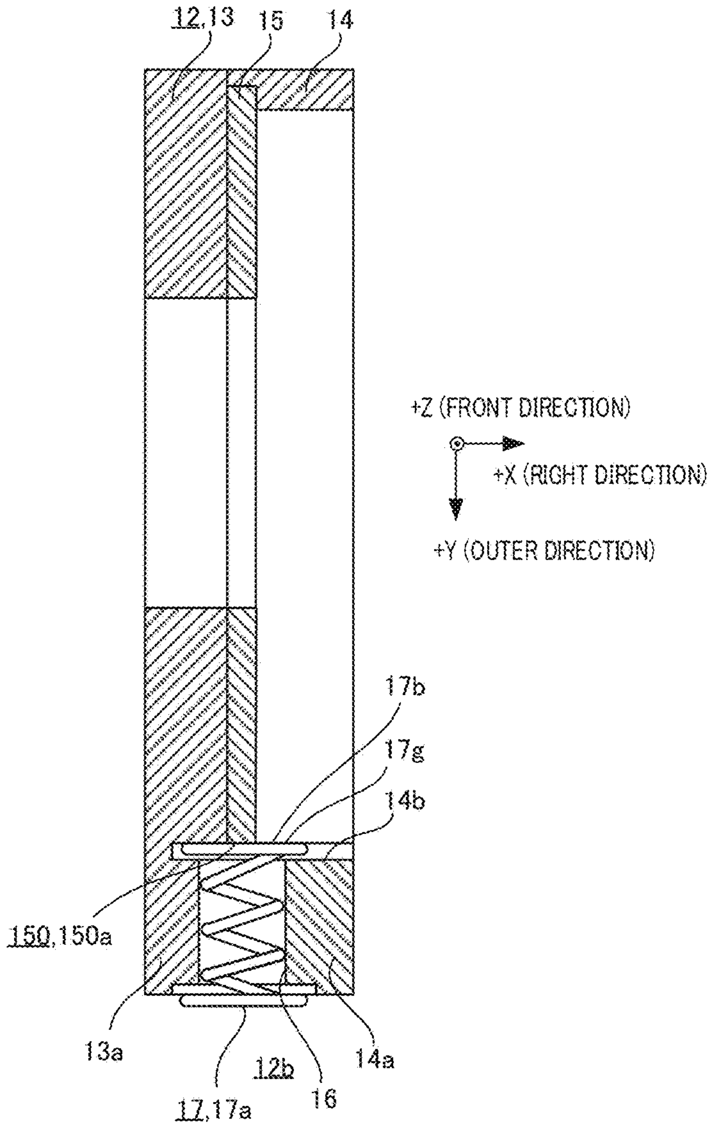
FIG. 10 is a cross-sectional view taken along line E-E of FIG. 9.
Figure 11:
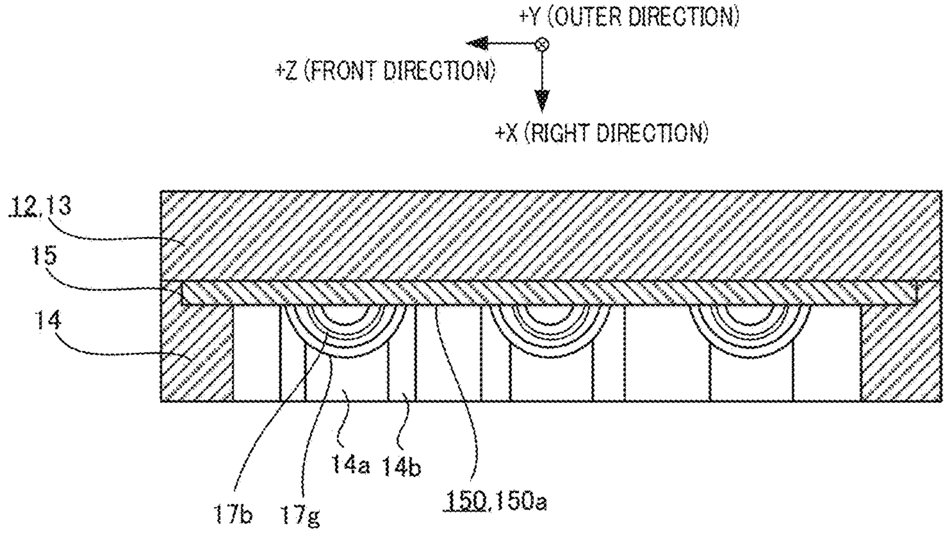
FIG. 11 is a cross-sectional view taken along line F-F of FIG. 9.

Next, a terminal structure of electronic component 1 according to Variation 3 will be described with reference to FIGS. 9, 10, and 11. FIG. 9 is a front view of a terminal structure of electronic component 1 according to Variation 3. FIG. 10 is a cross-sectional view taken along line E-E of FIG. 9. FIG. 11 is a cross-sectional view taken along line F-F of FIG. 9.

In coil spring 17 according to Variation 2, the outer diameter of inner end portion 17*b* of coil spring 17 is larger than the outer diameter of each of outer end portion 17*a* and the central portion, as illustrated in FIG. 6.

In contrast, in coil spring 17 according to Variation 3, as in Variation 2, an outer diameter of inner end portion 17*b* of coil spring 17 is larger than an outer diameter of a central portion, as illustrated in FIG. 9. That is, inner end portion 17*b* includes a locking portion that locks to a peripheral edge portion of inner groove opening 16*d*. Thus, as in Variation 2, even in a case where coil spring 17 is pulled outward (+Y direction) due to an erroneous operation, inner end portion 17*b* (locking portion) locks to the peripheral edge portion of inner groove opening 16*d*, and thus, it is possible to prevent coil spring 17 from coming off from guidance groove 16 to a side of outer portion 12*b* of electronic component main body 12. Since coil spring 17 does not come off from electronic component main body 12, electronic component 1 can be easily handled.

Further, in coil spring 17 according to Variation 3, an outer diameter of outer end portion 17*a* is larger than the outer diameter of the central portion. That is, outer end portion 17*a* includes a locking portion that locks to the peripheral edge portion of outer groove opening 16*c* of guidance groove 16 such that the outer end portion does not enter guidance groove 16 from the side of outer portion 12*b* of electronic component main body 12. This makes it possible to prevent outer end portion 17*a* (locking portion) from entering guidance groove 16 from the side of outer portion 12*b* of electronic component main body 12 due to an erroneous operation or the like.

Further, in Variation 3, as in Variation 2, fitting groove 16*e* is disposed in the peripheral edge portion of inner groove opening 16*d* of guidance groove 16. Further, in Variation 3, fitting groove 16*f* is disposed in the peripheral edge portion of outer groove opening 16*c* of guidance groove 16. Thus, movement in a radial direction of outer end portion 17*a* of coil spring 17 is limited, thereby increasing the contact stability of outer end portion 17*a* with a printed circuit board (not illustrated).

Further, as illustrated in FIGS. 10 and 11, guide groove 14*b* that guides inner end portion 17*b* in the left-right direction (X direction) is disposed in lower-side edge portion 14*a* according to Variation 3. A groove width of guide groove 14*b* is larger than a length of the outer diameter of inner end portion 17*b*. A right-side end of guide groove 14*b* extends to a right-side end of lower-side edge portion 14*a*. Further, a left-side end of guide groove 14*b* is connected to fitting groove 16*e*. Thus, at the time of assembly of electronic component 1, when second main body portion 14 is assembled to first main body portion 13 after coil spring 17 is fitted to first groove portion 16*a*, inner end portion 17*b* is guided along the left-right direction (X direction) by guide groove 14*b*. In this manner, second main body portion 14 is positioned with respect to first main body portion 13 in the up-down direction (Y direction) and the depth direction (Z direction), and it is only necessary to move second main body portion 14 in the left direction (−X direction) with respect to first main body portion 13, and thus, second main body portion 14 can be easily assembled to first main body portion 13.

In the above-described embodiment, locking hole 13*b* is provided on first main body portion 13, and locking hole 15*c* is provided on resistance substrate 15, but the present invention is not limited to this. For example, a locking hole to which locking portion 17*c* locks may be provided on either first main body portion 13 or resistance substrate 15.

The embodiment and variations described above are merely examples of specific implementation of the present invention, and the technical scope of the present invention should not be restrictively interpreted by these embodiments. That is, the present invention may be implemented in various forms without departing from the spirit thereof or the major features thereof.

This application is based on Japanese patent application No. 2022-071792, filed Apr. 25, 2022, the contents of which are incorporated herein by reference.

INDUSTRIAL APPLICABILITY

The present invention is suitably utilized in an electronic apparatus including an electronic component, which is required to reduce the assembly cost and to reduce the load on an electrical connection portion.

REFERENCE SIGNS LIST

1 Electronic component
12 Electronic component main body
12*a* Inner portion
12*b* Outer portion
13 First main body portion
13*a* Lower-side edge portion
13*b* Locking hole
14 Second main body portion
14*a* Lower-side edge portion
14*b* Guide groove
15 Resistance substrate
15*a* Right-side wall surface
15*c* Locking hole
150 Electrode pattern
150*a* Outer end portion
151 Input electrode pattern
152 Output electrode pattern
153 Ground electrode pattern
16 Guidance groove
16*a* First groove portion

16*b* Second groove portion
16*c* Outer groove opening
16*d* Inner groove opening
16*e* Fitting groove
16*f* Fitting groove
17 Coil spring
17*a* Outer end portion
17*b* Inner end portion
17*c* Locking portion
17*d* Locking portion
17*e* Locking portion
17*f* Locking portion
17*g* Locking portion
17*h* Extension portion
18 Input shaft
100 Electronic apparatus

The invention claimed is:

1. An electronic component, comprising:
- an electronic component main body; and
- a terminal that has conductivity,
- wherein the terminal is a coil spring that is fitted to a guidance groove provided in the electronic component main body in a manner capable of expanding and contracting, and that is in contact with a printed circuit board in a compressed state.

2. The electronic component according to claim 1, wherein:
- the guidance groove extends in a predetermined direction and communicates between an inner portion and an outer portion of the electronic component main body, and
- the coil spring is supported such that the coil spring does not come off from the guidance groove to an outer side of the electronic component main body.

3. The electronic component according to claim 2, wherein:
- the inner portion of the electronic component main body is provided with a resistance substrate, and
- the coil spring includes a first locking portion that locks to at least one of the electronic component main body and/or the resistance substrate such that the coil spring does not come off from the guidance groove to the outer side of the electronic component main body.

4. The electronic component according to claim 2, wherein the coil spring includes a second locking portion that locks to the guidance groove such that the coil spring does not come off from the guidance groove to the outer side of the electronic component main body.

5. The electronic component according to claim 2, wherein the coil spring includes a third locking portion that locks to a peripheral edge portion of an outer groove opening that is a groove opening on the outer side of the electronic component main body, such that an end portion located on the outer side of the electronic component main body in the coil spring does not enter the guidance groove from the outer portion of the electronic component main body.

6. The electronic component according to claim 3, wherein:
- at least one of the electronic component main body and/or the resistance substrate has a locking hole to which the first locking portion locks, and
- the locking hole is a long hole with the predetermined direction as a longitudinal direction.

7. The electronic component according to claim 2, wherein:
- the electronic component main body includes a first main body portion and a second main body portion, and
- the guidance groove is formed by arranging a first groove portion and a second groove portion to face each other in a direction orthogonal to the predetermined direction, the first groove portion being provided in the first main body portion, the second groove portion being provided in the second main body portion.

8. A terminal structure of an electronic component including an electronic component main body, the terminal structure comprising:
- a terminal that has conductivity,
- wherein the terminal is fitted to a guidance groove provided in the electronic component main body in a manner capable of expanding and contracting, and that is in contact with a printed circuit board in a compressed state.

9. An electronic apparatus, comprising:
- the electronic component according to claim 1;
- a case that houses the electronic component; and
- a printed circuit board.

* * * * *